(12) United States Patent
Milke et al.

(10) Patent No.: US 9,214,444 B2
(45) Date of Patent: Dec. 15, 2015

(54) ALUMINUM COATED COPPER RIBBON

(71) Applicant: Heraeus Materials Technology GmbH & Co. KG, Hanau (DE)

(72) Inventors: Eugen Milke, Nidderau (DE); Peter Prenosil, Hanau (DE); Sven Thomas, Frankfurt (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 14/399,003

(22) PCT Filed: May 7, 2013

(86) PCT No.: PCT/EP2013/059528
§ 371 (c)(1),
(2) Date: Nov. 5, 2014

(87) PCT Pub. No.: WO2013/167614
PCT Pub. Date: Nov. 14, 2013

(65) Prior Publication Data
US 2015/0137390 A1    May 21, 2015

(30) Foreign Application Priority Data

May 7, 2012    (EP) .................................... 12003603

(51) Int. Cl.
*H01L 23/00* (2006.01)
*H01B 1/02* (2006.01)
(Continued)

(52) U.S. Cl.
CPC ................. *H01L 24/48* (2013.01); *B21C 1/003* (2013.01); *B21C 9/00* (2013.01); *B32B 15/01* (2013.01);
(Continued)

(58) Field of Classification Search
CPC ........... H01L 2224/05624; H01L 2924/15747; H01L 2224/83447; H01L 24/48; H01L 25/072; H01L 25/165; B32B 15/01
See application file for complete search history.

(56) References Cited

U.S. PATENT DOCUMENTS

| 2004/0014266 | A1 | 1/2004 | Uno et al. |
| 2004/0217488 | A1 | 11/2004 | Luechinger |
| 2013/0213689 | A1 | 8/2013 | Milke et al. |

FOREIGN PATENT DOCUMENTS

| DE | 102010031993 A1 | 1/2012 |
| JP | 2011-192840 A | 9/2011 |

OTHER PUBLICATIONS

Int'l Search Report issued Aug. 14, 2013 in Int'l Application No. PCT/EP2013/059528.

(Continued)

*Primary Examiner* — Roy Potter
(74) *Attorney, Agent, or Firm* — Panitch Schwarze Belisario & Nadel LLP

(57) ABSTRACT

A ribbon, preferably a bonding ribbon for bonding in microelectronics, contains a first layer containing copper, a coating layer containing aluminum superimposed over the first layer, and an intermediate layer. In a cross-sectional view of the ribbon, the area share of the first layer is from 50 to 96% and the aspect ratio between the width and the height of the ribbon in a cross-sectional view is from 0.03 to less than 0.8. The ribbon has a cross-sectional area of 25,000 μm² to 800,000 μm². The intermediate layer contains at least one intermetallic phase containing materials of the first and coating layers. The invention further relates to a process for making a wire, to a wire obtained by the process, to an electric device containing the wire, to a propelled device comprising said electric device and to a process of connecting two elements through the wire by wedge-bonding.

24 Claims, 10 Drawing Sheets

(51) Int. Cl.
  *B21C 1/00* (2006.01)
  *B21C 9/00* (2006.01)
  *B32B 15/01* (2006.01)
  *H01L 25/07* (2006.01)
  *H01L 25/16* (2006.01)

(52) U.S. Cl.
  CPC ............... *H01B 1/023* (2013.01); *H01B 1/026* (2013.01); *H01L 24/43* (2013.01); *H01L 24/45* (2013.01); *H01L 24/85* (2013.01); *H01L 25/072* (2013.01); *H01L 25/165* (2013.01); *H01L 2224/43* (2013.01); *H01L 2224/4382* (2013.01); *H01L 2224/43848* (2013.01); *H01L 2224/45014* (2013.01); *H01L 2224/45015* (2013.01); *H01L 2224/45033* (2013.01); *H01L 2224/4569* (2013.01); *H01L 2224/45124* (2013.01); *H01L 2224/45147* (2013.01); *H01L 2224/45565* (2013.01); *H01L 2224/45572* (2013.01); *H01L 2224/45624* (2013.01); *H01L 2224/45644* (2013.01); *H01L 2224/45664* (2013.01); *H01L 2224/45669* (2013.01); *H01L 2224/4847* (2013.01); *H01L 2224/48091* (2013.01); *H01L 2224/48106* (2013.01); *H01L 2224/48137* (2013.01); *H01L 2224/48227* (2013.01); *H01L 2224/85051* (2013.01); *H01L 2924/00015* (2013.01); *H01L 2924/01006* (2013.01); *H01L 2924/01015* (2013.01); *H01L 2924/01047* (2013.01); *H01L 2924/01322* (2013.01); *H01L 2924/1203* (2013.01); *H01L 2924/12041* (2013.01); *H01L 2924/1305* (2013.01); *H01L 2924/1306* (2013.01); *H01L 2924/13055* (2013.01); *H01L 2924/14* (2013.01); *H01L 2924/207* (2013.01); *H01L 2924/2064* (2013.01); *H01L 2924/2075* (2013.01); *H01L 2924/20303* (2013.01); *H01L 2924/20304* (2013.01); *H01L 2924/20305* (2013.01); *H01L 2924/20641* (2013.01); *H01L 2924/20642* (2013.01); *H01L 2924/20643* (2013.01)

(56) References Cited

OTHER PUBLICATIONS

Partial European Search Report issued Dec. 17, 2012 in EP Application No. 12003603.3.

ALUMINUM COATED COPPER RIBBON

CROSS-REFERENCE TO RELATED APPLICATIONS

This application is a Section 371 of International Application No. PCT/EP2013/059528, filed May 7, 2013, which was published in the English language on Nov. 14, 2013, under International Publication No. WO 2013/167614 A1 and the disclosure of which is incorporated herein by reference.

BACKGROUND OF THE INVENTION

The invention relates to a ribbon, preferably a bonding ribbon for bonding in microelectronics, comprising a first layer comprising copper with a surface and at least a coating layer comprising aluminum superimposed over the surface of the first layer, and an intermediate layer. In a cross-sectional view of the ribbon, the area share of the first layer is in the range of from 50 to 96%, based on the total area of the cross-section of the ribbon. The aspect ratio between the width and the height of the ribbon in a cross-sectional view is in the range of from 0.03 to less than 0.8 and the ribbon has a cross-sectional area in the range of from 25,000 $\mu m^{-2}$ to 800,000 $\mu m^{-2}$. The intermediate layer, arranged between the first layer and the coating layer, comprises at least one intermetallic phase comprising material of the first layer and material of the coating layer. The invention further relates to a process for making a ribbon, to a ribbon obtained by the process, to an electric device comprising at least two elements and at least the ribbon, to a propelled device comprising the electric device and to a process of connecting two elements through the ribbon by wedge-bonding.

Bonding wires are used in the manufacture of semiconductor devices for electrically interconnecting an integrated circuit and a printed circuit board during semiconductor device fabrication. Further, bonding wires are used in power electronic applications to electrically connect transistors, diodes and the like with pads or pins of the housing. While bonding wires were made from gold in the beginning, nowadays less expensive materials, such as copper or aluminum, are used. While copper wire provides very good electric and thermal conductivity, wedge-bonding of copper wire has its challenges compared to wires made of aluminum. Moreover, copper wires are susceptible to oxidation of the wire.

With respect to wire geometry, very common are wires of circular cross-section. Another interesting geometry for bonding are ribbons which have a substantially rectangular cross-section. Both geometries have their advantages, making them useful for specific applications. Thus, both types of geometry have their share in the market. For example, ribbons have a larger contact area for a given cross-sectional area. However, bending of the ribbons is limited and orientation of the ribbon must be considered when bonding in order to arrive at acceptable electrical contact between the ribbon and the element to which it is bonded. Turning to bonding wires, these are more flexible to bending. However, bonding involves either soldering or larger deformation of the wire in the bonding process, which may cause harm or even destroy the bonding pad and underlying electric structures of the element which is bonded thereto.

Some recent developments were directed to bonding wires having a core and a shell, which is, for example, a coating layer. As core material, copper or gold are often chosen. With regard to the coating layer, aluminum is one of the more common choices. These core-shell bonding wires combine some of the advantages of copper wire and some of aluminum wire. Recent achievements make using standard wedge-bonding processes for such aluminum coated copper wires possible. Nevertheless, there is an ongoing need for further improving bonding technology with regard to the wire or the ribbon and the bonding processes.

BRIEF SUMMARY OF THE INVENTION

Accordingly, it is an object of the invention to provide improved ribbons.

It is another object of the invention to provide a ribbon, which has good processing properties and which has no specific needs when interconnecting, thus saving costs.

It is also an object of the invention to provide a ribbon which has excellent electrical and thermal conductivity.

It is a further object of the invention to provide a ribbon which exhibits an improved reliability.

It is a further object of the invention to provide a bonding technology by which failure and/or destruction of the bonded structure, or the structures underlying the bonded structure, is avoided.

It is a further object of the invention to provide a ribbon which exhibits excellent bondability.

It is another object of the invention to provide a ribbon which has improved resistance to corrosion and/or oxidation.

It is another object of the invention to provide a novel ribbon to be used with standard chip and bonding technology, which novel ribbon assures extended lifetime over conventional wires.

It is another object of the invention to provide a bonding technology which is simpler and thus provides cost saving compared with standard bonding processes of today.

It is a further object of the invention to provide means for closer packing in electrical devices.

It is a further object of the invention to provide an improved ribbon, which is at least as stable towards environmental oxidation and degradation as standard aluminum bonding ribbons.

It is a further object to provide improved electrical devices, in particular for power electronics, which have an extended lifetime compared to conventional devices in which the electrical elements are interconnected by standard aluminum wires and aluminum ribbons.

It is another object to provide improved electrical devices, in particular for power electronics, which operate at higher electrical current flow than conventional devices in which bonding is based on aluminum wires.

It is another object of the invention to provide such improved electrical devices which have the same dimensions and similar chip design as aforementioned conventional devices. It is another object to provide means for manufacturing such improved electrical devices on production lines originally designed for the manufacture of conventional electrical devices. This would minimize cost for implementing the improved technology.

It is a further object to provide improved electrical devices in which the probability of unintended internal electrical bridging is reduced compared to conventional electrical devices. Further, it is an object to simplify, or even to be able to omit, particular precautions with regard to unintended internal bridging in electrical devices.

Surprisingly, ribbons of the present invention have been found to solve at least one of the objects mentioned above. Further, a process for manufacturing these ribbons has been found which overcomes at least one of the challenges of manufacturing ribbons. Further, semiconductors comprising the ribbons of the invention were found to be more reliable at the interface between the ribbon according to the invention and other electrical elements, such as the printed circuit board, the pad/pin, etc.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
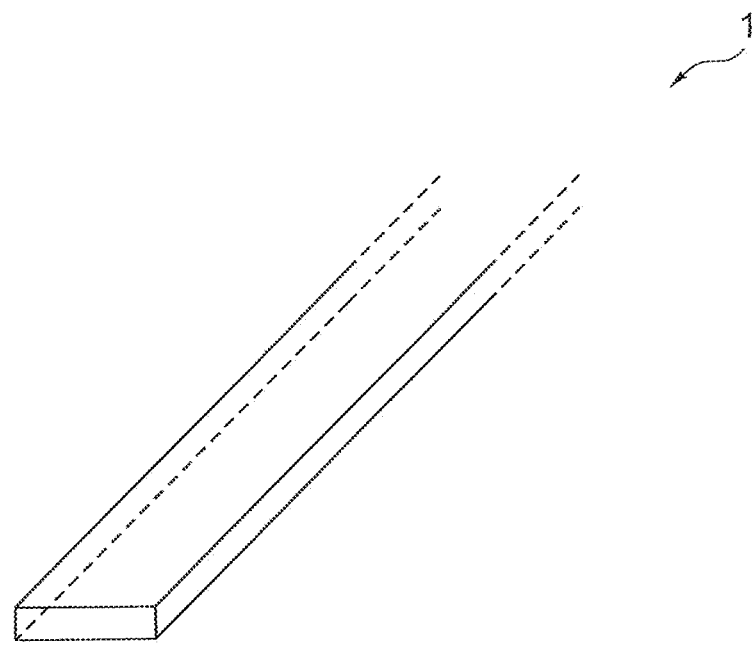
FIG. 1 depicts a ribbon 1.
Figure 2:
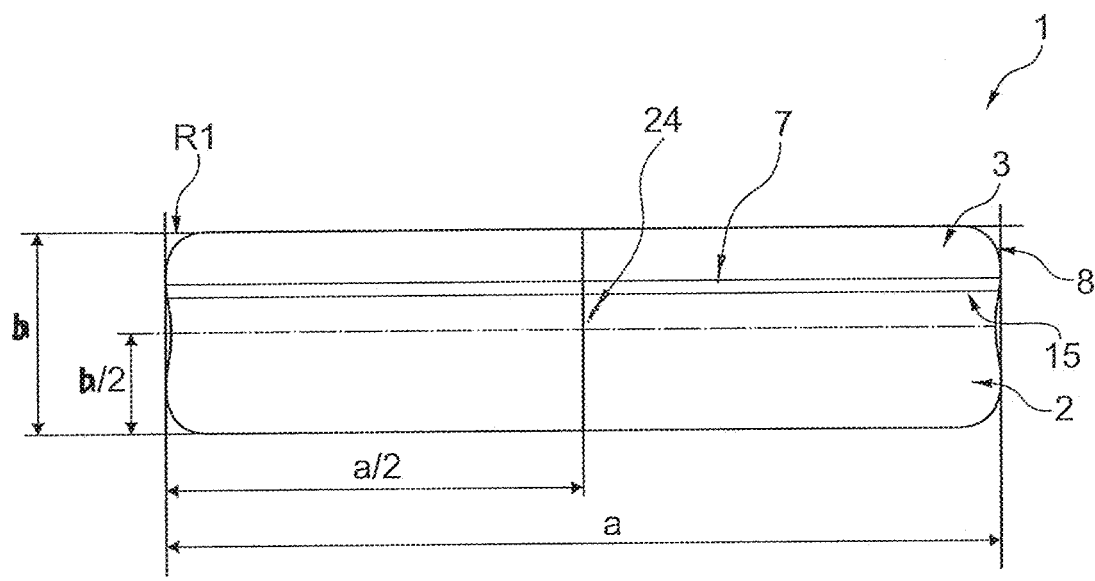
FIG. 2 shows a cross sectional view of ribbon 1 with boundary line 8. In the cross sectional view, a first layer 2 is shown. First layer 2 is adjacent to intermediate layer 7 which is adjacent to coating layer 3. (Virtual) Parallelogram R1 encompasses ribbon 1. The center 24 of ribbon 1 is located at position a/2, b/2 from the bottom left corner of parallelogram R1.
Figure 3:
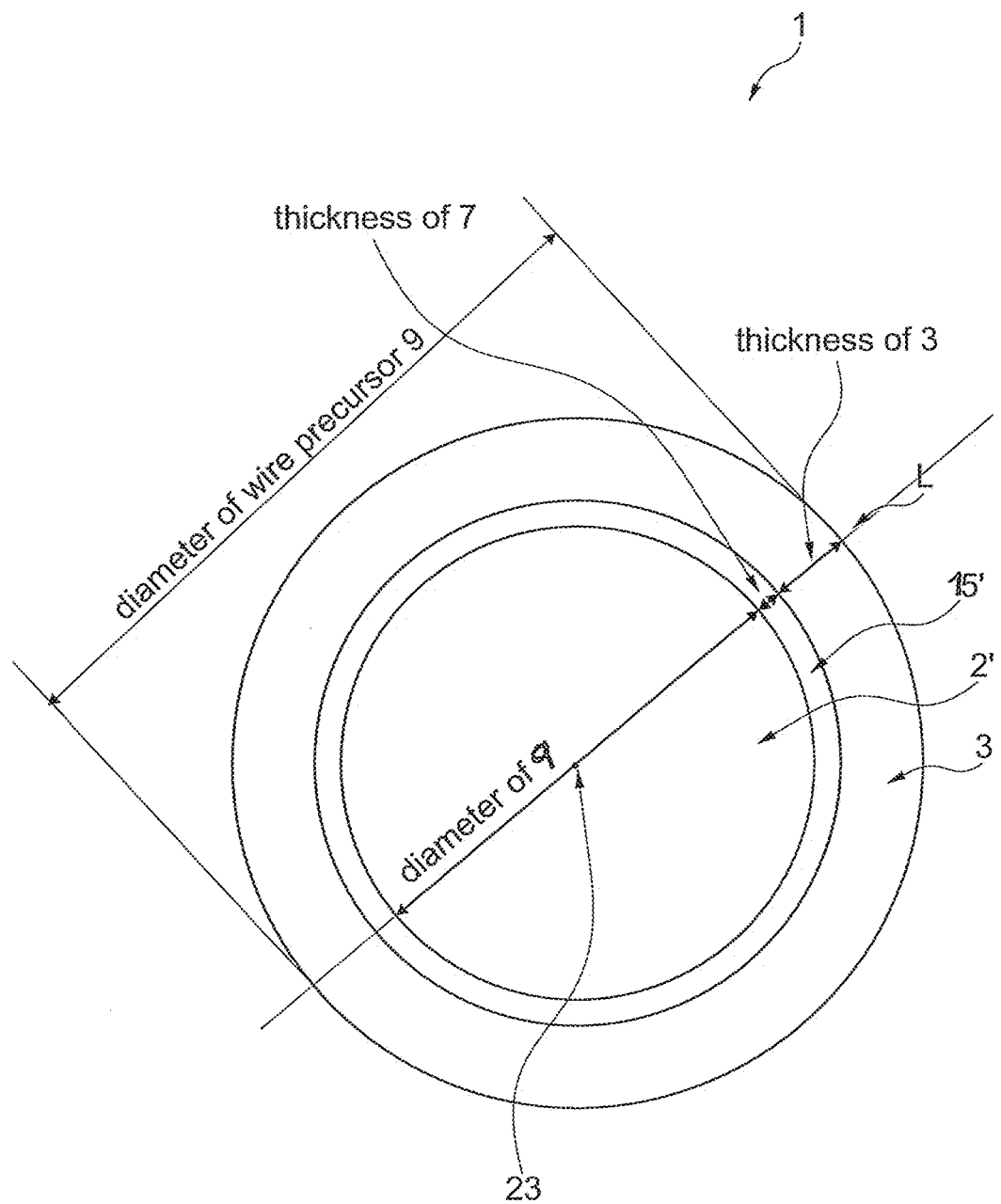
FIG. 3 depicts a cross sectional view of wire precursor 9. In the cross sectional view, a copper core 2' is in the middle of the cross sectional view. The copper core 2' is encompassed by a coating layer 3. On the limit of wire precursor 2', a surface 15' of the copper core is located. On a line L through the center 23 of wire precursor 9 the diameter of copper core 2' is shown as the end to end distance between the intersections of line L with the surface 15. The diameter of wire precursor 9 is the end-to-end distance between the intersections of line L through the center 23 and the outer limit of wire precursor 9. Besides, the thickness of coating layer 3 is depicted.
Figure 4:
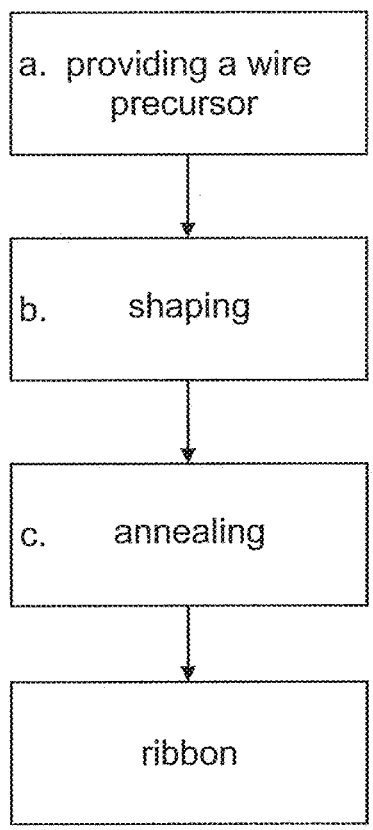
FIG. 4 shows a process according to the invention.
Figure 5:
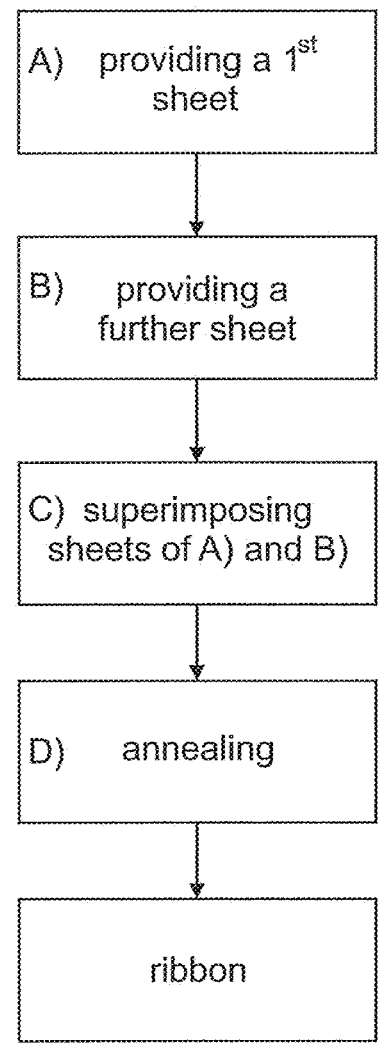
FIG. 5 shows another process according to the invention.
Figure 6:
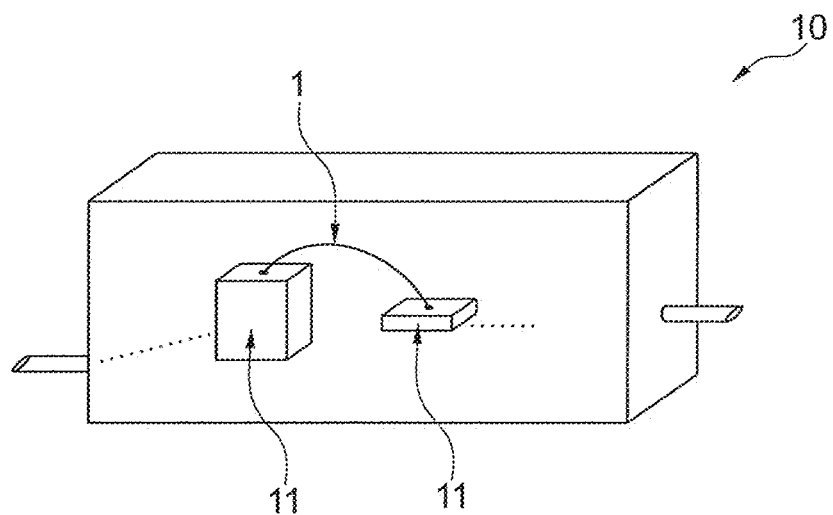
FIG. 6 depicts an electric device comprising two elements 11 and a ribbon 1. The ribbon 1 electrically connects the two elements 11.
Figure 7:
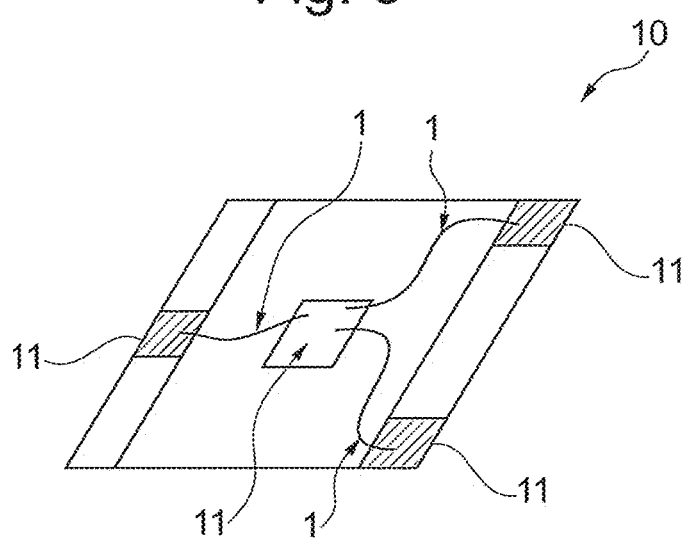
FIG. 7 depicts another electric device 10. Four elements 11 are electrically connected by three ribbons 1.
Figure 8:
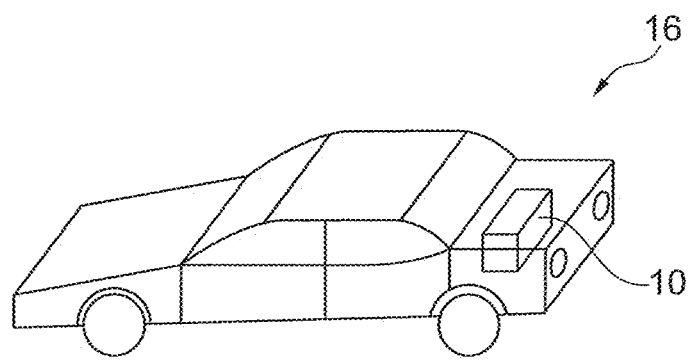
FIG. 8 depicts a propelled device 16, in this case a car, which comprises an electric device 10.
Figure 9:
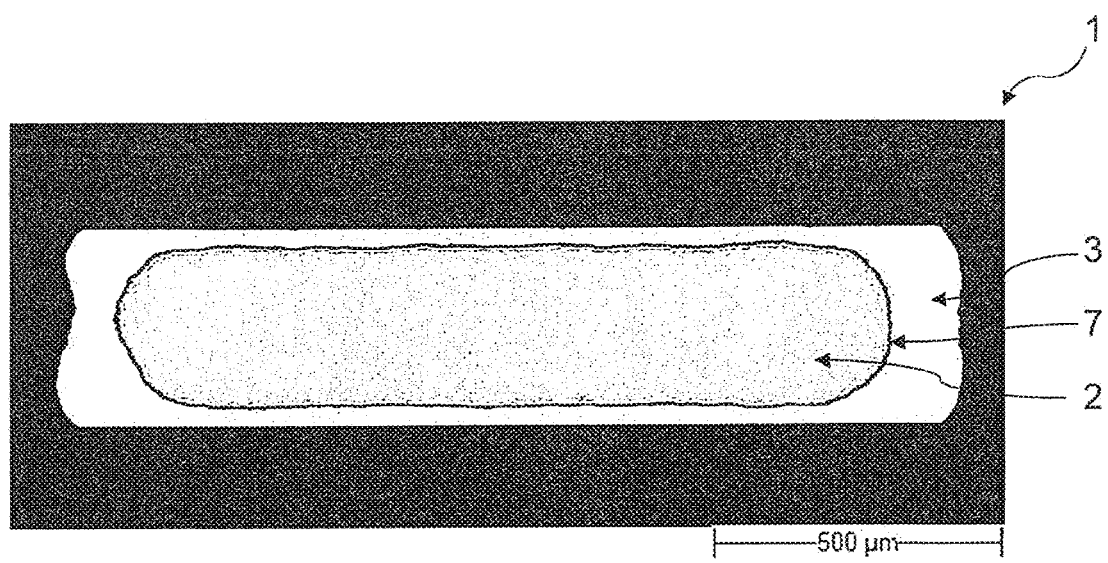
In FIG. 9, a cross sectional view of a piece of a ribbon according to the invention is shown.
Figure 10:
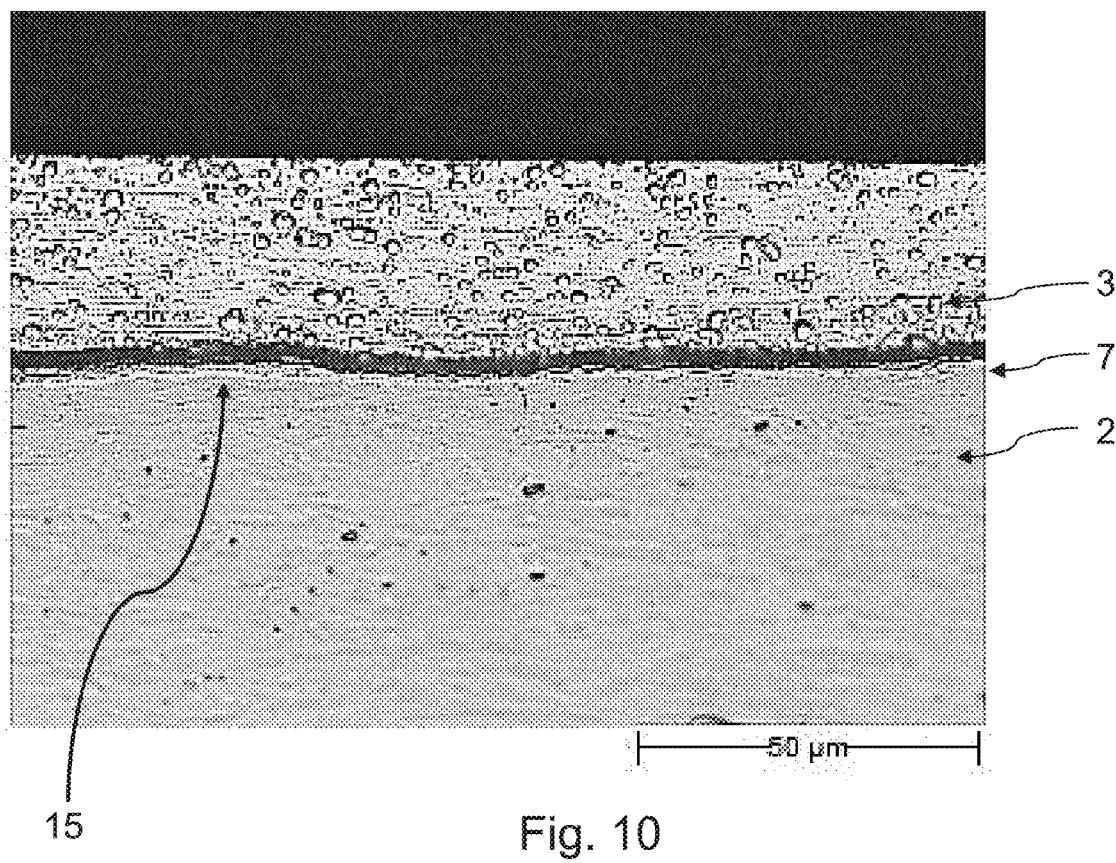
FIG. 10 depicts a magnification of a ribbon 1. From bottom to top are shown a section of a first layer 2 followed by an intermediate layer 7 and a coating layer 3 on top. The black area on top, which is adjacent to coating layer 3, is background and not part of the example.
Figure 11:
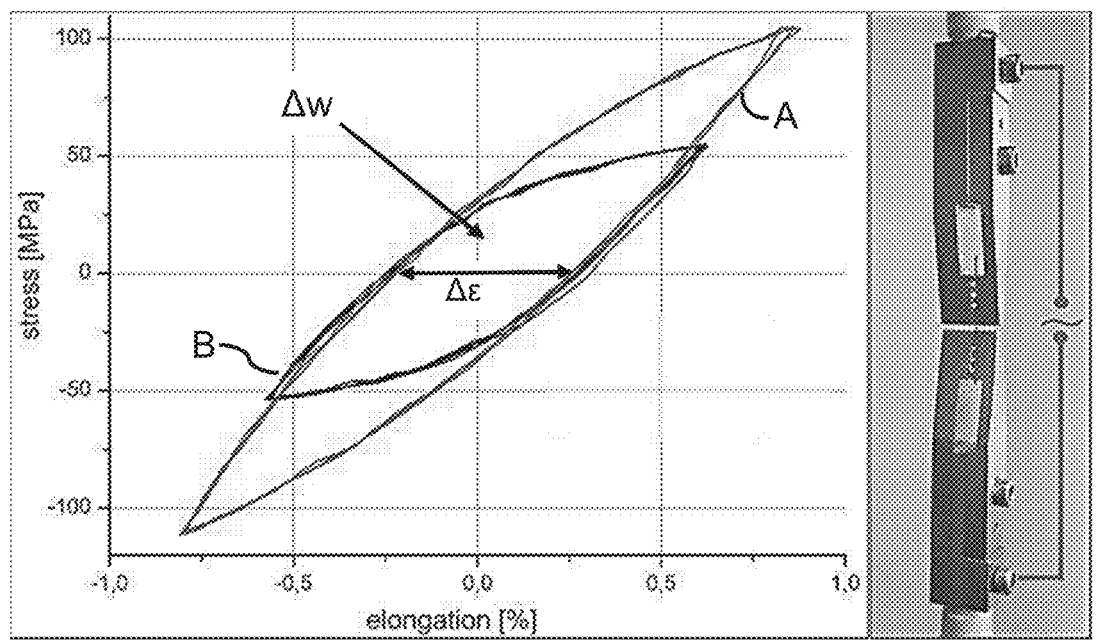
FIG. 11 depicts an exemplifying chart of the strain-uniaxial cyclic test. On the x axis, the elongation is shown in %. On the y axis, stress [MPa] is shown. The resulting curve from the experiment is a hysteresis loop. The curve marked with A was recorded by a ribbon according to the invention, curve B was recorded with a reference ribbon made from pure aluminum. $\Delta\epsilon pl$ and $\Delta w$ are determined as described in the test method.
Figure 12:
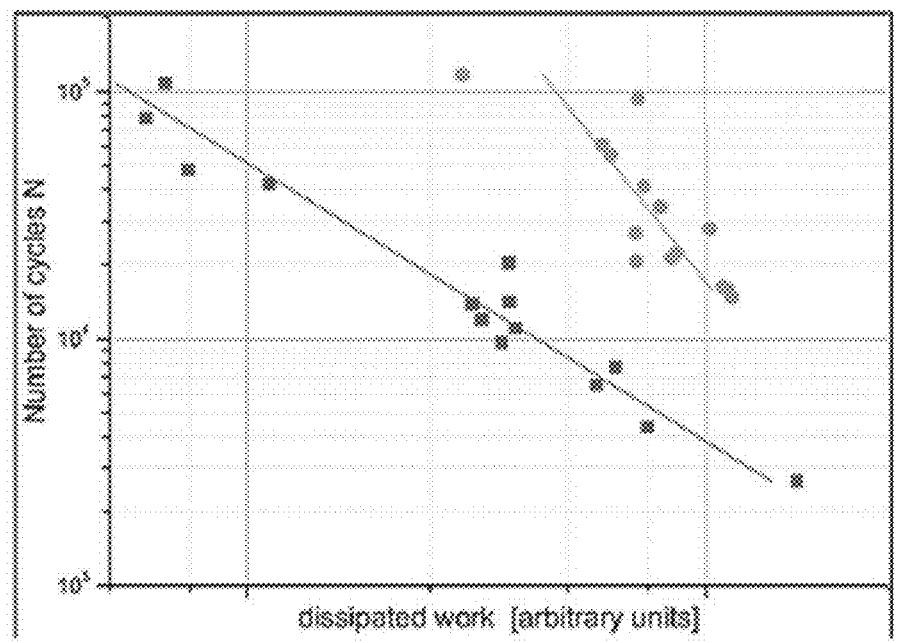
FIG. 12 and FIG. 13 show a plurality of measurements as described for FIG. 11 collecting the resulting for dissipated work in a chart in FIG. 12 and for plastic strain in FIG. 13. Values marked with round dots were recorded by a ribbon according to the invention, values marked with rectangular dots was recorded with a reference ribbon made from pure aluminum.
Figure 13:
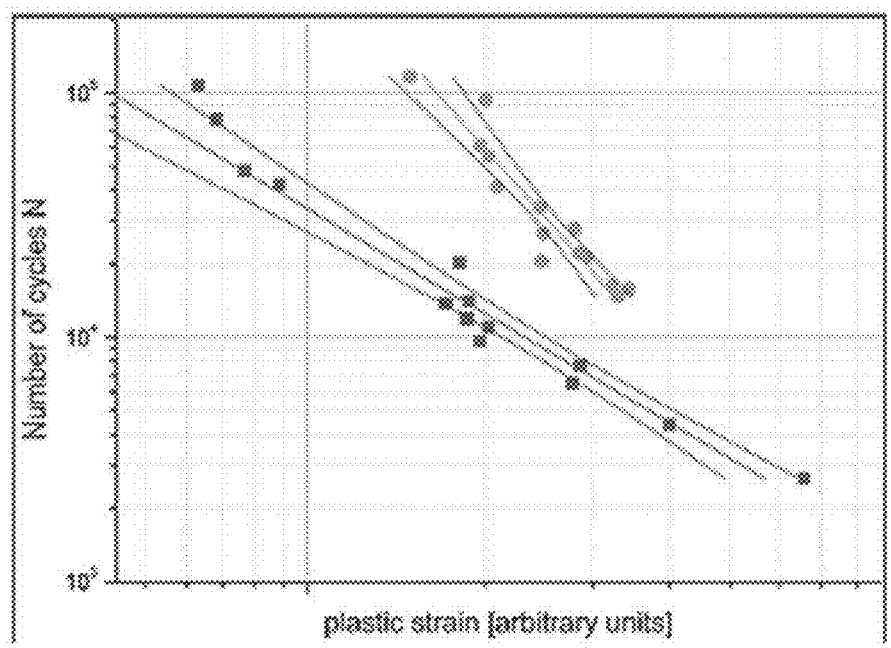
Figure 14:
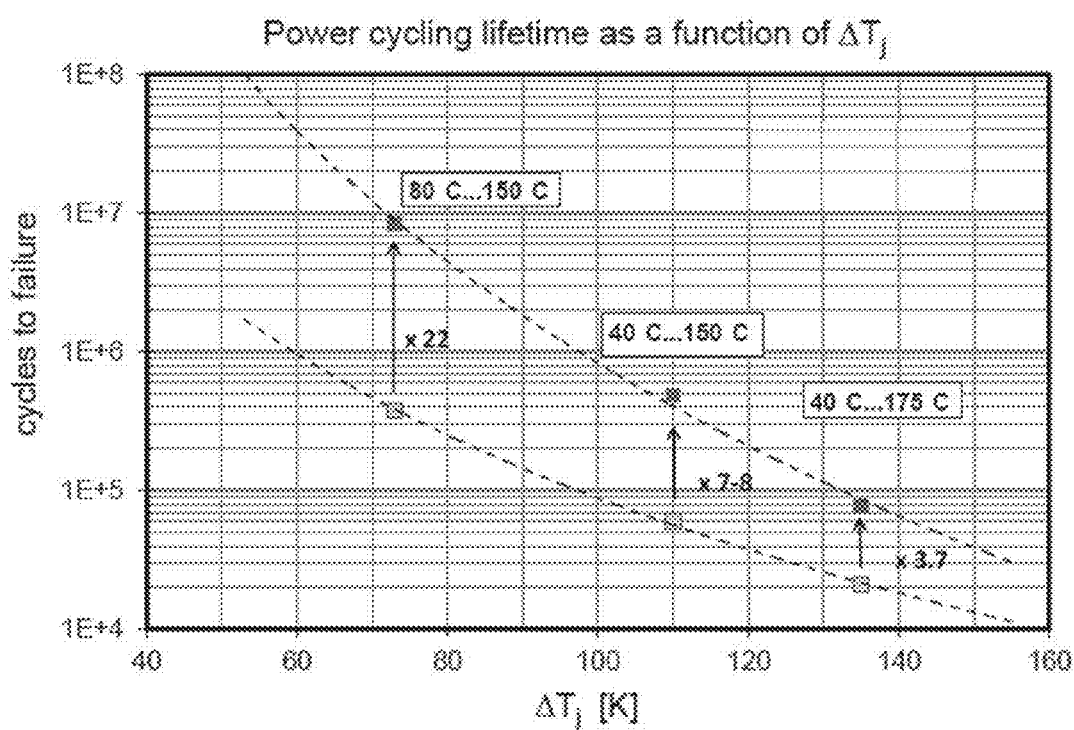
FIG. 14 shows a chart collecting the results of power cycling tests. On the x axis the $\Delta T$, which is the difference between the temperature at start of a cycle and at stop of a cycle, is shown. On the y axis the number of cycles until failure is shown. In this chart, a curve for a sample ribbon made from pure aluminum is shown (curve fit through light rectangular dots). Further, a curve for ribbon according to the invention is shown (curve fit through dark rectangular dots). According to the chart the number of cycles to failure is for the ribbon of the invention at least three times as high as for a reference ribbon made from pure aluminum.
Figure 15:
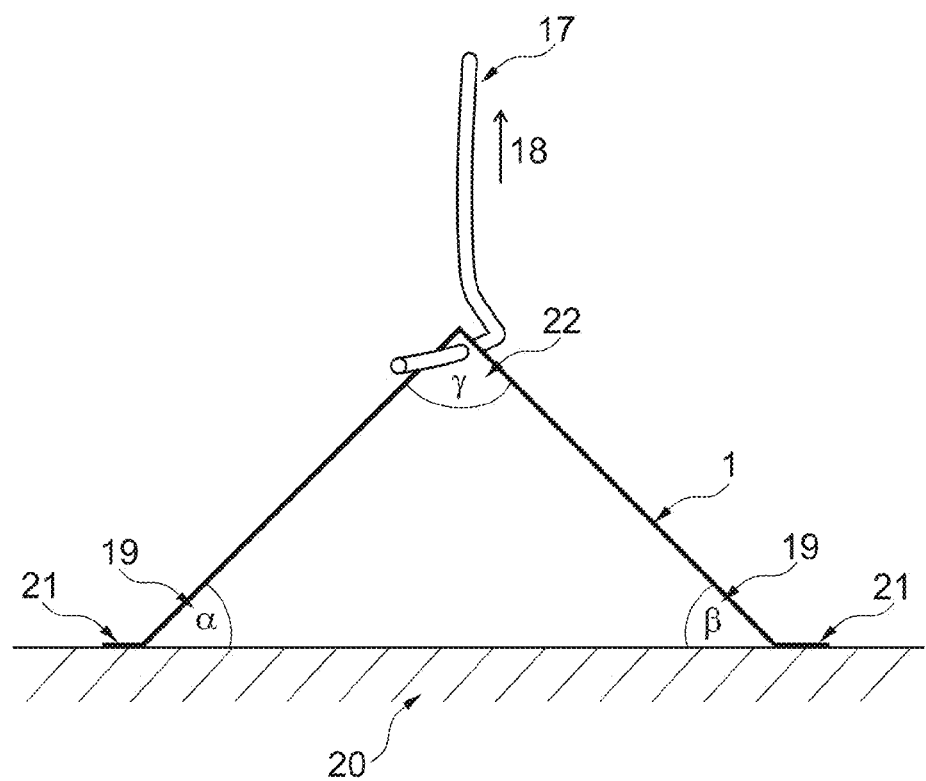
FIG. 15 shows a sketch of a ribbon pull test. To a substrate 20, a ribbon 1 is bonded in bonds 21 at an angle 19 of 45°. A pull hook 17 pulls ribbon 1. The angle 32, which is formed when the pull hook 17 pulls wire 1, is 90° C.

A first aspect of the invention is a ribbon comprising:
a. a first layer comprising copper with a surface; and
b. at least a coating layer superimposed over the surface of the first layer, wherein the coating layer comprises aluminum, and
c. an intermediate layer.

In a cross-sectional view of the ribbon, the area share of the first layer is in the range of from 50 to 96%, preferably in the range of from 60 to 95%, or from 65 to 92%, or from 70 to 92%, each based on the total area of the cross-section of the ribbon, and the aspect ratio between the width and the height of the ribbon in a cross-sectional view is in the range of from 0.03 to less than 0.8, preferably from 0.03 to 0.5, or from 0.1 to 0.3.

The ribbon has a cross-sectional area in the range of from 25,000 $\mu m^2$ to 800,000 $\mu m^2$, preferably from 100,000 $\mu m^2$ to 600,000 $\mu m=^2$.

The intermediate layer (7) is arranged between the first layer (2) and the coating layer (3) and the intermediate layer (7) comprises at least one intermetallic phase comprising material of the first layer (2) and material of the coating layer (3).

The ribbon is preferably a bonding ribbon for bonding in microelectronics. The ribbon is preferably a one-piece object. The criteria for aforementioned cross-sectional view and the diameter should be met within at least 80%, preferably 90%, of the longitudinal extension of the ribbon.

The term "a cross-sectional view" in the present context refers to a view of a cut through the ribbon, wherein the plane of the cut is perpendicular to the longitudinal extension of the ribbon. The cross-sectional view can be found at any position on the longitudinal extension of the ribbon A cross-sectional view of the ribbon is used to evaluate the dimensions of the ribbon. For further reference, a parallelogram R1 is drawn enclosing the ribbon so that the difference of the area $A_{R1}$ of parallelogram R1 and the area $A_{ribbon}$ of the ribbon is minimal compared to all other parallelograms Rx that can be drawn to enclose the ribbon. Parallelogram R1 has two sides a and two sides b, wherein side a is longer than side b. The center of the ribbon is found at (a/2, b/2) position based on any vertex of parallelogram R1.

The "width" of the ribbon in a cross-sectional view is the average end-to-end distance between the boundary line of the ribbon and all lines which can be positioned parallel to side a of parallelogram R1 through the ribbon.

The "height" of the ribbon in a cross-sectional view is average end-to-end distance between the boundary line of the ribbon and all lines which can be positioned parallel to side b of parallelogram R1 through the ribbon.

The term "diameter" is the arithmetic mean of all geometric diameters of any plane and in any direction, wherein all planes are perpendicular to the longitudinal extension of the wire.

The term "superimposed" in the context of this invention is used to describe the relative position of a first item, such as a layer, a sheet, or a copper core, with respect to a second item, such as a coating layer or another sheet. Possibly, further items, such as an intermediate layer, may be arranged between the first and the second item. Preferably, the second item is at least partially superimposed over the surface of the first item, for example, for at least 30%, 50%, 70% or for at least 90% with respect to the total surface of the first item.

The term "thickness" of a layer in the context of this invention is used to define the arithmetic mean of the size of the layer determined in a cross-sectional view of the ribbon, wherein the arithmetic mean is determined with respect to R1 in direction parallel to side b on position a' in the range of from $(a/2)-0.4*a$ to $(a/2)+0.4*a$.

The term "intermediate layer" in the context of this invention with respect to a ribbon is a region of the ribbon between the first layer and the coating layer. In this region, material as in the first layer as well as material as in the coating layer are present in combination, for example, in the form of at least one intermetallic phase.

The term "intermetallic phase" in the context of this invention is used to define a phase of two or more metals, wherein the different elements are ordered into different sites in the structure, which sites have distinct local environments and often a well-defined, fixed stoichiometry. This is different than alloys, in which the different elements are randomly distributed.

All of aforementioned dimensions of length: thickness, diameter, longest path, and shortest path, are determined in a cross-sectional view as defined above.

Preferably, the ribbon of the invention has a substantially rectangular area in a cross-sectional view of the ribbon. The ribbon of the invention may have rounded edges.

The "surface" of the first layer of a coated, possibly annealed ribbon is defined to be the virtual limit of the first layer around its center, which virtual limit is where the concentration of Cu deviates more than 9.9%-wt. from the concentration of Cu at the center of the ribbon, which center is defined as above.

The first layer according to the invention comprises at least 95% by weight, based on the total weight of the first layer, of elemental copper (Cu) with a purity of at least 99.9% Cu. Preferably, the first layer according to the invention comprises at least 98% by weight, based on the total weight of the first layer, of Cu of a purity of at least 99.99%, or 99.999%, or 99.9999%.

According to a preferred aspect of the invention, the oxygen content of aforementioned copper in the first layer is in a range of from 0.1 to 80 ppm, preferably from 0.5 to 70 ppm, or from 1 to 60 ppm, or from 5 to 50 ppm, or from 10 to 50 ppm.

The coating layer comprising aluminum is preferably selected from the group consisting of aluminum, aluminum alloys or a combination of the two.

Preferred aluminum is elemental aluminum (Al) with a purity of at least 99.9% Al. More preferably, the purity of aluminum is at least 99.99% Al, or 99.999% Al. Usually, such coating layers form a thin layer of aluminum oxide at the aluminum-air interface.

Preferably, the coating layer comprises at least 80% by weight, more preferably at least 90% by weight, based on the total weight of the coating layer, of aluminum with a purity of 99.9%, more preferably a purity of 99.99%, or of 99.999% Al.

Preferred examples of aluminum alloys are alloys with magnesium (AlMg) and alloys of aluminum with 1%-wt. of silicon (AlSi1), based on the total amount of the alloy.

According to another aspect of the invention, the width of the ribbon is in the range of from 100 to 5000 µm, preferably from 500 to 2000 µm, or from 1000 to 2000 µm.

According to another aspect of the invention, the height of the ribbon is in the range of from 50 to 500 µm, preferably from 500 to 400 µm, or from 100 to 300 µm, or from 100 to 200 µm.

Preferred combinations of width and height of the ribbon are 500 µm×50 µm, 1000 µm×100 µm, 2000 µm×200 µm, 2000 µm×300 µm and 2000 µm×400 µm.

The intermediate layer of the ribbon is defined to be the region of the ribbon between the first layer and the coating layer in which the concentration of Cu deviates more than 5%-wt. based on the total weight of the intermediate layer, from the concentration of Cu in the first layer, based on the total weight of the first layer, and in which the concentration of Al deviates more than 5%-wt., based on the total weight of the intermediate layer, from the concentration of Al in the coating layer, based on the total weight of the coating layer.

Aforementioned dimensions of the ribbon, i.e., the thickness of the coating layer, the thickness of the intermediate layer, and the diameter of the copper core can be determined in a cross-sectional view of the ribbon, such as by using light microscopy or scanning electron microscopy. In light microscopy, the first layer is colored in copper red, the coating layer is silvery and the intermediate layer is grey. The concentrations of copper and aluminum which were described above, can be determined using combined SEM/EDX. (Scanning electron microscopy/energy dispersive X-ray spectroscopy).

According to another aspect of the invention, the area share of the intermediate layer in any cross-sectional view of the ribbon is in the range of from 0.1 to 15%, preferably from 0.1 to 10%, or from 0.3 to 5%, or from 0.8 to 8.5%, each based on the total area of the cross-section of the ribbon.

According to another aspect of the invention, the thickness of the intermediate layer is in the range of from 0.1 to 5 µm, preferably from 0.5 to 3 µm. The aforementioned criteria for thickness of the intermediate layer should be met within at least 80%, preferably 90% of the longitudinal extension of the ribbon. Sometimes, deviations in the thickness of the intermediate layer may occur due to imperfections of the intermediate layer, such as pores.

According to another aspect of the invention, the standard deviation of the thickness of the intermediate layer is in the range of from 0.05 to 0.5 µm, preferably from 0.1 to 0.3 µm.

According to another aspect of the invention, the area share of the coating layer at a cross-sectional view of the ribbon is in the range of from 3.9 to 50%, preferably from 8 to 40%, each based on the total area of the cross-section of the ribbon.

According to another aspect of the invention, the thickness of the coating layer is in the range of from 10 to 70 µm, preferably from 20 to 70 µm, or from 20 to 60 µm.

According to another aspect of the invention, the standard deviation of the thickness of the coating layer is in the range of from 0.1 to 10 µm, preferably from 0.5 to 7 µm, or from 1 to 6 µm.

According to another aspect of the invention, the thickness of the first layer is in the range of from 25 to 380 µm, preferably from 80 to 350 µm, or from 150 to 300 µm.

According to another aspect of the invention, the standard deviation of the thickness of the first layer is in the range of from 0.1 to 10 μm, preferably from 0.5 to 7 μm, or from 1 to 6 μm.

According to another aspect of the invention, the dissipated work is at least two times, preferably at least three times as high for a ribbon according to the invention than the dissipated work for a reference ribbon made from pure Al. Preferably, the dissipated work is at least two times, preferably at least three times as high for a ribbon according to the invention than the dissipated work for a reference ribbon made from pure Al in a testing cycle in the range of from 20,000 to 120,000 testing cycles. More preferably the dissipated work is at least two times, preferably at least three times as high for a ribbon according to the invention than the dissipated work for a reference ribbon made from pure Al in all testing cycles in the range of from 20,000 to 120,000 testing cycles. In some cases, however, the dissipated work for a ribbon according to the invention is not more than ten times as high as the dissipated work of a reference ribbon made from pure Al. The reference ribbon made from pure Al is a ribbon made of aluminum of a purity of 99.999% which is doped with 50 ppm Nickel (sold by Heraeus/Germany under "AL-H11 CR") and which has the same cross-sectional area as the ribbon of the invention.

According to another aspect of the invention, the maximum strain is at least 1.5 times, preferably at least two times, or at least four times as high for a ribbon according to the invention than the maximum strain for a reference ribbon made from pure Al. Preferably, the maximum strain is at least two times, preferably at least four times as high for a ribbon according to the invention than the maximum strain from a reference ribbon made from pure Al in a testing cycle in the range of from 20,000 to 120,000 testing cycles. More preferably, the maximum strain is at least two times, preferably at least four times as high for a ribbon according to the invention than the maximum strain for a reference ribbon made from pure Al in all testing cycles in the range of from 20,000 to 120,000 testing cycles. In some cases, however, the maximum strain of a ribbon according to the invention is not more than five times as high than the maximum strain of a reference ribbon made from pure Al. The reference ribbon made from pure Al is a ribbon made of aluminum of a purity of 99.999% which is doped with 50 ppm Nickel (sold by Heraeus/Germany under "AL-H11 CR") and which has the same cross-sectional area as the ribbon of the invention.

According to another aspect of the invention the number of cycles under same conditions in the power cycling test is at least three times, preferably at least four times as high for a ribbon according to the invention than the power cycling test for a reference ribbon made from pure Al in a testing cycle in the range of from 20,000 to 120,000 testing cycles. More preferably, the power cycling test is at least three times, preferably at least four times as high for a ribbon according to the invention than the power cycling test for a reference ribbon made from pure Al in all testing cycles in the range of from 20,000 to 120,000 testing cycles. In some cases, however, the power cycling test for a ribbon according to the invention is not more than 30 times as high than the dissipated work of a reference ribbon made from pure Al. The reference ribbon made from pure Al is a ribbon of aluminum with a purity of 99.999% which is doped with 50 ppm Nickel (sold by Heraeus/Germany under "AL-H11 CR") and which has the same cross-sectional area as the ribbon of the invention.

According to another aspect of the invention, the bond shear is as high for a ribbon according to the invention as for a reference ribbon made from pure Al. This test is described below. The reference ribbon made from pure Al is a ribbon made of aluminum with a purity of 99.999% which is doped with 50 ppm Nickel (sold by Heraeus/Germany under "AL-H11 CR") and which has the same cross-sectional area as the ribbon of the invention.

According to another aspect of the invention, the pull of is at least 10% higher for a ribbon according to the invention than for a reference wire made from pure Al. The reference ribbon made from pure Al is a ribbon made of aluminum with a purity of 99.999% which is doped with 50 ppm Nickel (sold by Heraeus/Germany under "AL-H11 CR") and which has the same cross-sectional area as the ribbon of the invention.

According to another aspect of the invention, the ribbon of this invention meets at least two or even all of the aforementioned test conditions, i.e., dissipated work, maximum strain, power cycling test, wire bond shear and wedge pull.

Another aspect of the invention is a process for manufacturing a ribbon, comprising at least the following steps:

a. providing a wire precursor comprising a copper core with a surface and a coating layer, which coating layer is superimposed over the surface of the copper core, wherein the coating layer comprises aluminum, wherein in a cross-sectional view of the wire precursor the area share of the copper core is in the range of from 50 to 90%, preferably 60 to 100%, or 70 to 95%, each based on the total area of the cross-section of the wire precursor, and wherein the aspect ratio between the longest path and the shortest path through the wire precursor in a cross-sectional view is in the range of from larger than 0.8 to 1.0, preferably from 0.9 to 1.0, wherein the wire precursor has a diameter in the range of from 0.5 to 5 mm, preferably of from 0.75 to 3 mm, or from 0.75 to 2 mm, b. shaping the wire precursor to obtain a ribbon precursor, and c. annealing the shaped ribbon precursor to form an intermediate layer (7) is formed, and then the ribbon is obtained.

The ribbon preferably has a cross-sectional area in the range of from 25,000 to 800,000 μm$^2$, or from 100,000 μm to 600,000 μm.

Aspects of the invention directed to the ribbon described above are also preferred aspects of the ribbon obtained by aforementioned process for manufacturing a ribbon.

In order to evaluate the dimensions of a wire precursor, the "longest path" through the wire precursor in a cross-section is the longest chord which can be laid through the cross-section of the wire precursor within the plane of the cross-sectional view.

The "shortest path" through the wire precursor in a cross-section is the longest chord perpendicular to the longest path within the plane of the cross-sectional view defined above.

If the wire has a perfect circular cross-section, then the longest path and the shortest path become indistinguishable and share the same value.

Preferably, the wire precursor has a substantially circular area in a cross-sectional view of the wire precursor.

The "surface" of the copper core of an uncoated copper wire precursor is the wire precursor/air interface.

The "surface" of the copper core of a coated, possibly annealed wire precursor is defined as the virtual limit of the copper core around its center, which virtual limit is where the concentration of Cu deviates more than 9.9%-wt. from the concentration of Cu at the center of the wire precursor, which center is defined by the intersection of the shortest and the longest path both as defined above.

The term "intermediate layer" in the context of this invention with respect to a wire precursor is a region of the wire precursor, between the copper core and the coating layer. In this region, material as in the core as well as material as in the coating layer is present in combination, for example, in form of at least one intermetallic phase.

According to another aspect of the invention, the diameter of the copper core is in the range of from 100 to 500 μm, preferably from 150 to 400 μm, or from 200 to 300 μm, or from 230 to 250 μm, each determined in a cross-sectional view of the wire precursor.

According to another aspect of the invention, the ratio of the thickness of the coating layer to the diameter of the copper core is in the range of from 0.05 to 0.2, preferably 0.05 to 0.15, or from 0.1 to 0.15, each determined in a cross-sectional view of the wire precursor.

According to another aspect of the invention, the ratio of the standard deviation of the diameter of the copper core and the diameter of the copper core is in the range of from 0.1 or less, or 0.05 or less, or 0.03 or less, or 0.03 to 0.001, each determined in a cross-sectional view of the wire precursor.

According to another aspect of the invention, the thickness of the coating layer is in the range of from 10 to 60 μm, preferably from 20 to 50 μm, or 20 to 40 μm, or from 25 to 35 μm, each determined in a cross-sectional view of the wire precursor. The aforementioned criteria for thickness of the coating layer should be met within at least 80%, preferably 90% of the longitudinal extension of the wire precursor.

According to another aspect of the invention, the wire precursor has a ratio between the standard deviation of the thickness of the coating layer and the thickness of the coating layer is in the range of from 0.05 to 0.5, preferably from 0.1 to 0.3.

According to another aspect of the invention, an intermediate layer is arranged between the core and the coating layer of the wire precursor. The intermediate layer preferably comprises at least one intermetallic phase comprising material of the core and material of the coating layer. The intermediate layer usually shows concentration gradients for each of the materials involved. An intermetallic phase is formed if both materials are metals.

According to a preferred aspect of the invention, the intermediate layer is arranged between the core and the coating layer of the wire precursor, wherein the intermediate layer is adjacent to the copper core and adjacent to the coating layer.

The first layer of the wire precursor according to the invention comprises at least 95% by weight, based on the total weight of the first layer, of elemental copper (Cu) of a purity of at least 99.9% Cu. Preferably, the first layer according to the invention comprises at least 98% by weight, based on the total weight of the first layer, of Cu of a purity of at least 99.99%, or 99.999%, or 99.9999%.

According to a preferred aspect of the invention, the oxygen content of aforementioned copper in the first layer of the wire precursor is in a range of from 0.1 to 80 ppm, preferably from 0.5 to 70 ppm, or from 1 to 60 ppm, or from 5 to 50 ppm, or from 10 to 50 ppm.

The intermediate layer of the wire precursor is defined to be the region of the wire precursor between the copper core and the coating layer, in which the concentration of Cu deviates more than 5%-wt., based on the total weight of the intermediate layer, from the concentration of Cu in the copper core, based on the total weight of the copper core, and in which the concentration of the Al deviates more than 5%-wt., based on the total weight of the intermediate layer, from the concentration of Al in the coating layer, based on the total weight of the copper core.

Aforementioned dimensions of the wire precursor, i.e., the thickness of the coating layer, the thickness of the intermediate layer and the diameter of the copper core can be determined in a cross-sectional view of the wire precursor, e.g. using light microscopy or scanning electron microscopy. In light microscopy, the first layer is colored in copper red, the coating layer is silvery and the intermediate layer is grey. The concentrations of copper and aluminum which were described above, can be determined using combined SEM/EDX. (Scanning electron microscopy/energy dispersive X-ray spectroscopy).

A wire precursor as in step a. can be obtained by forming an aluminum coating layer on at least part of the surface of a copper wire. Preferably the aluminum layer is formed on 100%, or from 80 to 100%, or from 60 to 80%, of the surface of the copper wire, each with respect to the total surface area of the copper wire. Numerous techniques for forming an aluminum layer on a copper surface and in particular on copper wire are known. Preferred techniques are plating, such as electroplating and electroless plating, deposition of aluminum from the gas phase such as sputtering, ion plating, vacuum evaporation and chemical vapor deposition, and deposition of aluminum from the melt.

Pretreatment of the copper wire can be employed to adapt the surface roughness and/or to add a pattern to the surface of the copper wire. Numerous techniques are known to adapt the surface of the copper wire. Preferred techniques are cold roll forming, grinding and electrochemical grinding.

Numerous techniques are known to shape the wire precursor. Preferred techniques are rolling, swagging, die drawing or the like, of which die drawing is particularly preferred. More preferably, the wire precursor is drawn in 3 to 20 steps, wherein in each step an elongation of the wire precursor of from 6 to 18% in length is performed. A slipping agent may be employed. Suitable slipping agents are numerous and known to the skilled person. A ribbon precursor is obtained by shaping the wire precursor.

Another aspect of the invention is a process for manufacturing a ribbon comprising at least the following steps:
A) providing a first sheet comprising copper of a purity of at least 99.9%,
B) providing at least one further sheet comprising aluminum of a purity of 99.9%, wherein in cross-sectional views of the first sheet and the at least one further sheet, the ratio of the cross-sectional area of the first sheet to the cross-sectional area of the at least one further sheet is in the range of from 1:1 to 4:1, preferably from 1.2:1 to 3.8:1,
C) superimposing the sheets provided in step a. and b., combining the sheets to obtain a ribbon precursor and shaping of the ribbon precursor, and
D) annealing the shaped and combined sheets, to form an intermediate layer and then obtain the ribbon.

The ribbon preferably has a cross-sectional area in the range of from 25,000 to 800,000 μm$^2$, or from 100,000 μm to 600,000 μm.

Aspects of the invention directed to the ribbon described above are also preferred aspects of the ribbon obtained by aforementioned process for manufacturing a ribbon.

According to an aspect of the invention, at least two further sheets comprising aluminum of a purity of 99.9% are provided. In this case, the first sheet is preferably positioned between the at least two further sheets when superimposing the sheet in step C).

In step C), the sheets provided in step A) and B) are superimposed, combined and then shaped to obtain a shaped ribbon precursor. Superimposing said sheets is often performed directly prior to combining. Combining can be performed according to numerous techniques known in the art, preferably by rolling. Yet more preferred the thickness and the cross-sectional area of the ribbon precursor are adjusted during rolling to the desired height of the ribbon. Adapting of the cross-sectional area is performed by drawing the ribbon while rolling.

Shaping of the ribbon precursor can be performed according to numerous techniques known in the art, preferably by cutting the ribbon precursor to a shaped ribbon precursor using a cutting die appropriately selected from those known in the art. Yet more preferred, the width of the shaped ribbon precursor is adjusted by cutting to the desired with of the ribbon.

According to another aspect of the invention, the first layer is coated with a coating on the side, which is averted from the at least one further layer. The coating can be an organic coating, which should substantially withstand the temperatures during. Preferably, the coating is a metallic layer, e.g., comprising palladium, platinum or gold, which prevents the first layer from oxidizing during subsequent annealing. Such coating are sometimes applied to help protecting the bond-tool during bonding processes In step c. and step d. of the process, the ribbon is obtained by annealing the shaped ribbon precursor. Numerous procedures are known in the art to anneal a ribbon precursor, e.g. annealing of a ribbon precursor can be performed in both a continuous or in a discontinuous process. In special applications, continuous and discontinuous processes may even be combined.

According to a preferred aspect of the invention, the annealing is performed by heating the ribbon precursor to a temperature in the range of from 140 to 400° C., preferably from 160 to 350° C., or from 200 to 300° C., or from 220 to 280° C. and the temperature is maintained for 30 minutes to 5 hours, preferably from 30 minutes to 3 hours. Then, the ribbon which was obtained by annealing the ribbon precursor is cooled to room temperature. The cooling can be performed in various ways. One suitable way is to expose the ribbon to ambient air at ambient temperature upon leaving the heating zone.

The cooling of the ribbon to room temperature (T=20° C.) according to aforementioned procedure can be usually achieved within 24 hours. A quenching of the ribbon should be avoided, e.g. by immersion in cold water and the like. Accordingly, another aspect is a process in which the cooling of the ribbon upon leaving the heating zone is not performed by quenching of the ribbon.

According to another aspect of the invention the annealing is performed in a continuous process, more preferably in a tube furnace. Even more preferred the ribbon precursor is drawn from the step of providing a wire precursor and the shaping and the annealing by a single drawing machine.

Drawing speed during annealing in a tube furnace depends on the length of the tube of the tube furnace. As longer the tube, as higher drawing speeds are feasible in order to obtain a certain exposure of energy to a piece of ribbon precursors. Preferred lengths of tubes of tube furnaces are in the range of from 0.8 to 2.5 m, or from 1 to 2 m, or from 1.5 to 2.5 m.

The temperature in the tube of the furnace can be adjusted to the drawing speed, or evaluated independently. Preferred temperatures in the tube are in the range of from 150 to 600° C., or from 200 to 600° C., or from 250 to 550° C. In general, the temperature is selected to be lower than the temperature at which at least one of the components or a mixture of at least two components present in the ribbon precursor liquefies. For example, if partially soluble or insoluble two- or multi-components alloys are annealed, the eutectic temperature of the alloy should not be exceeded by the temperature in the oven.

According to another aspect of the invention, the temperature in the furnace is chosen to be at least 30° C., or 50° C., or 80° C. lower than the temperature at which at least one of the components or a mixture of at least two components of the ribbon precursor liquefies.

According to another aspect of the invention the annealing speed is chosen in the range of from 1 to 20 m/min., or from 1 to 16 m/min., or from 2 to 18 m/min.

According to another aspect of the invention, the annealing can be performed in an inert atmosphere or a reducing atmosphere. This applies to both annealing in continuous processes, such as in tube furnace, as well as in discontinuous processes. Numerous inert atmosphere as well as reducing atmospheres are known in the art. Of the known inert atmospheres, nitrogen is preferred. Of the known reducing atmospheres, hydrogen is preferred. Further, preferred reducing atmospheres are mixtures of nitrogen and hydrogen. Preferably, mixtures of nitrogen and hydrogen are preferred which are in the range of from 90 to 98%-Vol. nitrogen and of from 10 to 2 Vol-% hydrogen, each referring to the total volume of the mixture. Preferred mixtures of nitrogen/hydrogen are equal to 93/7, 95/5 and 97/3 Vol-%/Vol-%, each based on the total volume of the mixture. Applying reducing atmospheres in annealing is particularly preferred, if some parts of the surface of the ribbon precursor are sensitive to oxidation by oxygen of the air, e.g. if copper of the ribbon precursor is exposed to its surface.

According to another aspect of the invention, the annealing is performed in a tube furnace at a temperature in the range of from 150° C. to 600° C., preferably at a drawing speed in the range of from 1 to 20 m/min, yet more preferable in an reducing atmosphere.

Another aspect of the invention is a ribbon obtained by a process defined above.

According to another aspect of the invention, the ribbon is characterized by at least one of the following features:
   a. the dissipated work is at least two times as high for a ribbon according to the invention than the dissipated work for a reference ribbon made from pure Al;
   b. the maximum strain in a uniaxial cyclic test is at least 1.5 times as high for a ribbon according to the invention than the maximum strain for a reference ribbon made from pure Al;
   c. the power cycling test is at least three times as high for a ribbon according to the invention than for a reference ribbon made from pure Al;
   d. the pull of a ribbon according to the invention is at least 10% higher for the ribbon than for a reference ribbon made from pure Al;
   e. the bond shear of a ribbon according to the invention is as high for the ribbon as for a reference ribbon made from pure Al;
   f. the electrical conductivity of a ribbon according to the invention is 20% to 55% higher than the electrical conductivity of a reference ribbon made from pure Al.

The reference ribbon made from pure Al in the above is a ribbon made of aluminum with a purity of 99.999% which is doted with 50 ppm Nickel (sold by Heraeus/Germany under "AL-H11 CR") and which has the same cross-sectional area as the ribbon of the invention.

Another aspect of the invention is an electric device comprising two elements and at least a ribbon as defined above or a ribbon manufactured as described above.

According to another aspect of the invention, at least one ribbon in the electric device is connected to another element of the electric device by wedge bonding, preferably by ultrasonic wedge bonding.

According to another aspect of the invention, at least one of the elements is selected from the group consisting of a substrate, an IGBT (i.e., an insulated gate bipolar transistor), an integrated circuit, a transistor, or a diode, such as a light emitting diode or a photo diode.

Another aspect of the invention is a use of the ribbon described above or of ribbon manufactured according to a process as described above in wedge-wedge bonding interconnections between a control unit and a controlled device.

Another aspect of the invention is a propelled device, preferably a propelled vehicle, a solar cell or a wind turbine, which propelled device comprises at least one electric device as described above.

Another aspect of the invention is a process for making an electric device comprising the steps of
   a. providing at least two elements; and
   b. connecting the two elements through a ribbon as described above, wherein at least one of the connections is performed by wedge bonding.

Wedge bonding technology is known in the art and extensively described in the literature, e.g., in Shankara K. Prasad, "Advanced Wirebond Interconnection Technology", Kluwer Academic Publishers, 2004, ISBN 1-4020-7762-9, in particular Chapter I (introduction) and Chapter IV (process technology).

Test Methods

All tests and measurements were conducted at T=20° C. and a relative humidity of 50%. In general, all tests described for ribbons can be performed in a similar manner using wire.
Electrical Conductivity Both ends of a test specimen, i.e., a ribbon of 1.0 meter in length, were connected to a power source providing a constant current of I=10 mA. The voltage was recorded with a device for measuring voltage. This set-up was repeated with at least four test specimens. The arithmetic mean of the four measurements was used for the calculations given below.

The resistance R was calculated according to R=U/I.

The specific resistivity $\rho$ was calculated according to $\rho=(R \times A)/l$, wherein A is the mean cross-sectional area of the wire and l the length of the wire between the two measuring points of the device for measuring voltage.

The specific conductivity $\sigma$ was calculated according to $\sigma=1/\rho$.
Layer Thickness For determining the thickness of the coating layer, the thickness of the intermediate layer and the diameter of the core, the ribbon was cut perpendicular to the maximum elongation of the ribbon. The cut was carefully grinded and polished to avoid smearing of soft materials such as Al. A picture was recorded through an optical microscope or a scanning electron microscope (SEM), wherein the magnification was chosen so that the full cross-section of the wire was shown.

This procedure was repeated at least 15 times. All values are provided as arithmetic mean of the at least 15 measurements.
Wedge-Wedge Bonding—Parameter Definition (for Ribbons)

Bonding of a ribbon onto a substrate made of CuSn6 plated with AlSi1 (available from Heraeus/Germany) was performed at 20° C., wherein the bonding was applied to the AlSi1 surface. Ribbons are always wedge bonded on the side of the ribbon, which is coated with an aluminum coating layer. If a ribbon has more than one side coated with an aluminum layer, the wedge bonding is performed at the same side, i.e., on the same aluminum layer. Wedge bonding is always applied to ribbons on their flat surfaces. After forming a first wedge bond with an angle of 45° between the ribbon and the substrate, the ribbon was wedged with its second end to the substrate. The distance of the bonds between the two ends of the ribbon was in the range of from 5 to 20 mm. This distance was selected in order to assure the angle of 45° between the ribbon and the substrate. During wedge bonding, ultrasonic sound at a frequency in the range of 60 to 120 kHz was applied to the bond tool for 90 to 500 milliseconds. The same wedge bonding conditions were applied for all ribbons to be tested.
Pull Test (for Ribbons)

Pull tests were conducted according to MIL-STD-883G Method 2011.7 (1989), Condition D on a XYZTEC Condor 150 machine. In deviation to this standard, a ribbon was used which was wedge-bonded on its aluminum coated flat surface onto an aluminum substrate made of CuSn6 plated with AlSi1 (available from Heraeus/Germany) at an angle of 45°, wherein the bonding was applied to the AlSi1 surface. The distance of the bonds between the two ends of the ribbon were in the range of from 5 to 20 mm. This distance was selected in order to assure the angle of 45° between the ribbon and the substrate. The loop was pulled in the middle of the loop at a pull speed of 2,500 µm/s. The pull hook used was a XYZTec TOR051200.
Bond Shear Test (for Ribbons)

Bond shear tests were conducted according to AEC-Q101-003 Rev-A (07.2005) on a XYZTEC Condor 150 machine. In deviation to this standard, a ribbon was used which was wedge-bonded on its aluminum coated flat surface onto an aluminum substrate made of CuSn6 plated with AlSi1 (available from Heraeus/Germany) at an angle of 45°, wherein the bonding was applied to the AlSi1 surface. The shear test was performed shearing the broad side of the wedged bond, i.e. the end of the ribbon. Then, the shear tool was lowered to the substrate at a speed of 50 m/s to define zero height. Next, the shear tool was retracted 35 µm from the surface of the substrate. Then, shearing was conducted at a rate of 250 µm/s. The bond shear failure mode was also recorded: (1) bond lifting; (2) bond shearing; (3) cratering; (4) bonding surface lifting (separation of the bonding surface from its underlying substrate).
Strain and Dissipated Work—Uniaxial Cyclic Test (for Ribbons)

A sample of straight ribbon was clamped in a machine to apply mechanical strain (tension and compression). The length of ribbon exposed to mechanical testing is 1.0 mm. Cycling of the sample was performed at a strain rate of 1%/s until failure of the sample (breakage of wire). The machine recorded the force transmitted by sample. The plastic strain amplitude ($\Delta\epsilon_{pl}$) and the dissipated work ($\Delta w$) are each plotted versus number of cycles (N) until failure.

$\Delta\epsilon_{pl}$ is defined as strain difference at zero stress of increasing and decreasing branches of hysteresis loop.

$\Delta w$ is defined as the integral of one hysteresis loop.
Power Cycling Test Samples were produced by wedge bonding a diode EMCON 4 High Power Chip (available from INFINEON Technologies AG, Munich, Germany) to a base plate using the ribbon to be tested. As described above, wedge bonding parameters were chosen in a suitable way, assuring that all bonded ribbons show the same area of contact between the ribbon and the base plate ($A_{c\,ref}$). Of the commercially available base plates, a base plate was chosen that will retain the die attached (the diode) during the test. All samples were prepared using identical base plates.

Power cycling tests were conducted on a ITC5230 supplied from Integrated Technology Corporation, Tempe, Ariz. 85281, USA. For testing, a sample was mounted on a cooling pad through which the sample was permanently cooled at constant flow rate using a fluid having a temperature 20° C. at the inlet of the cooling pad. To assure a defined transfer of heat dissipated by the sample, a heat conducting film was arranged between the sample and the cooling pad. The electrodes of ITC5230 were contacted to the diode and to the base plate.

Prior to the power cycling test, the amount of electrical current ($I_0$) at a preset voltage ($V_0$) and the time were evaluated, which are necessary to effect an increase in temperature to 175° C. of the sample from a starting temperature of 40° C. This time is the ON-time of a cycle. After that, the cooling time of the sample to cool down from 175° C. to 40° C. was evaluated, while no electrical current was applied to the sample. This time is the OFF-time. A sequence of one ON-time followed by one OFF-time defines one power cycle.

Then, the power cycling test was performed by continuously applying aforementioned power cycles. At preset electrical current $I_0$, the voltage ($V_t$) during ON-time of a power cycle was recorded. The power cycling test was finished, when the voltage $V_t$ during an ON-time period exceeded the voltage $V_f$. $V_f = (V_0 + 10\%)$.

Electrical Defects after Bonding

A set of 250 samples made under identical conditions according to the wedge-wedge bonding procedure described above were evaluated for electrical defects. Each of the samples has two bonds, which adds up to 500 bonds in total. Depending on the number of defects, each set was flagged with ++, +, 0, − or −− (see Table 2) as follows:
++=0%
+=<2%
0=2-5%
−=5-10%
−−=>10%

Tensile Strength Test

This test was conducted on a Zwick Z250 testing machine according to DIN EN ISO 6892-1:2009, procedure A, with the following parameters: initial gauge length $L_0$=100 mm; Test conditions: Temperature=20° C. Until $R_{p0.2}$, the strain rate was 1 mm/min. Beyond $R_{p0.2}$, the sample was drawn at a strain rate of 10 mm/min until fracture. The tensile strength obtained by dividing the maximum force $F_m$ by the initial cross section $S_0$ of the sample. The Elongation equals $\Delta L/L_0$, wherein $\Delta L$ is the change in gauge length.

Examples

The invention is further exemplified by examples. These examples serve for exemplary elucidation of the invention and are not intended to limit the scope of the invention or the claims in any way.

Examples 1-4

Ribbons from Coated Wire Precursor

A wire of overall diameter 1 mm having an aluminum coating of thickness 115 µm and a diameter of the copper core 770 µm was elongated using three drawing dies, each providing an elongation of 12% to obtain a wire of a diameter of 700 µm. Then the wire was rolled resulting in a ribbon of the desired thickness was obtained. Then, the ribbon was annealed in an oven for 1 hour at the annealing temperature T detailed in Table 1. After the annealing, the ribbon was cooled to ambient temperature was within 24 hours. The properties of these ribbons are collected in Table 1.

Examples 5-8

The ribbons were prepared as Examples 1-4. However, the copper core had a diameter of 840 µm and an aluminum coating of 80 µm. The overall wire diameter was 1 mm.

Examples C1, C2

These ribbons were prepared as Examples 1-4. However, the copper core of C1 had a diameter of 220 µm and an aluminum coating of 390 µm. The copper core of C2 had a diameter of 975 µm and an aluminum coating of 12.5 µm.

Examples 9-16, C3, C4

Ribbons from Sheets

To prepare ribbons according to examples 9-12, a sheet of copper of a purity of 99.9% having thickness of 700 µm was combined with a sheet of aluminum of a purity of 99.9% having a thickness of 220 µm, so that the edges of the two sheets lined up with each other. To obtain a ribbon precursor, the combined sheets were subjected to rolling. The thickness of the ribbon precursor depended on the pressure applied to the rolls. Then, the ribbon precursor was cut into ribbons and annealed in a tubular oven of a length of 0.9 m at the temperature and the annealing speed described in Table 2 below, whereby the ribbon was obtained. Then, the ribbon was cooled ambient temperature within 24 hours. Examples 13-16 were prepared accordingly. However, the sheet of copper had a thickness of 500 µm and the sheet of aluminum a thickness of 220 µm. Table 2 provides a summary.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

TABLE 1

Ribbons Made from Coated Wires

| Example No. | Area Share Source Material Cu/Al | Targeted Dimensions of Ribbon Width (µm) | Targeted Dimensions of Ribbon Thickness (µm) | Annealing Temperature [T (° C.)] | Tensile Strength [N/mm²] | Elongation [%] | Pull test [cN] | Shear test [cN][1] | Specific Conductivity [m/Ω * mm²] | electrical defects after bonding |
|---|---|---|---|---|---|---|---|---|---|---|
| 1 | 60/40 | 2000 | 300 | 190 | 228.6 | 2.5 | 0 | 0 | 47.35 | −− |
| 2 | 60/40 | 2000 | 300 | 230 | 201.4 | 20 | 4713.9 | 6481.7 | 47.35 | 0 |
| 3 | 60/40 | 2000 | 300 | 280 | 182.8 | 35.7 | 6050.8 | 7019.4 | 47.35 | + |
| 4 | 60/40 | 2000 | 300 | 300 | 182 | 34.5 | 6331.2 | 7209.1 | 47.35 | + |

TABLE 1-continued

Ribbons Made from Coated Wires

| Example No. | Area Share Source Material Cu/Al | Targeted Dimensions of Ribbon Width (μm) | Targeted Dimensions of Ribbon Thickness (μm) | Annealing Temperature [T (° C.)] | Tensile Strength [N/mm²] | Elongation [%] | Pull test [cN] | Bond Shear test [cN][1] | Specific Conductivity [m/Ω * mm²] | electrical defects after bonding |
|---|---|---|---|---|---|---|---|---|---|---|
| 5  | 70/30 | 2000 | 300 | 180 | 268.2 | 2.1  | 0       | 0      | 49.65 | -- |
| 6  | 70/30 | 2000 | 300 | 230 | 230.1 | 18.4 | 4815.9  | 6118.4 | 49.65 | 0 |
| 7  | 70/30 | 2000 | 300 | 280 | 216.4 | 34.2 | 6287.6  | 7046.7 | 49.65 | + |
| 8  | 70/30 | 2000 | 300 | 330 | 211.1 | 35.1 | 6418.2  | 7099.2 | 49.65 | + |
| C1 | 5/95  | 2000 | 300 | 200 | 98.1  | 19.4 | 5675.15 | 7264.1 | 37.72 | ++ |
| C2 | 95/5  | 2000 | 200 | 500 | 234.1 | 21.4 | 0       | 0      | 56.53 | -- |

[1]All failures were observed to fail in failure mode (2) - bond shearing.

TABLE 2

Ribbons Made from Sheets

| Example No. | Area Share Source Material Cu/Al | Targeted Dimensions of Ribbon Width (μm) | Targeted Dimensions of Ribbon Thickness (μm) | Annealing Temperature [T (° C.)] | Annealing speed [m/min] | tensile strength [N/mm²] | Elongation [%] | Pull test [cN] | Bond shear test [cN][2] | Specific Conductivity [m/Ω * mm²] | electrical defects after bonding |
|---|---|---|---|---|---|---|---|---|---|---|---|
| 9  | 80/20 | 2000 | 250 | 500 | 6 | 183.3  | 33.57 | 5449.4  | 5914.2 | 52.19 | − |
| 10 | 80/20 | 2000 | 250 | 500 | 5 | 183    | 33.35 | 6061.3  | 6518.4 | 52.19 | 0 |
| 11 | 80/20 | 2000 | 250 | 500 | 4 | 182.7  | 33.35 | 6114.3  | 7081.6 | 52.19 | 0 |
| 12 | 80/20 | 2000 | 250 | 500 | 3 | 180.4  | 31.93 | 6092.1  | 7194.3 | 52.19 | 0 |
| 13 | 66/33 | 2000 | 250 | 500 | 6 | 159.46 | 18.89 | 4287.2  | 3114.3 | 49.35 | -- |
| 14 | 66/33 | 2000 | 250 | 500 | 5 | 161.07 | 30.6  | 5504.1  | 6091.5 | 49.35 | − |
| 15 | 66/33 | 2000 | 250 | 500 | 4 | 158.89 | 31.57 | 5811.7  | 7138.1 | 49.35 | + |
| 16 | 66/33 | 2000 | 250 | 500 | 3 | 155.64 | 29.65 | 5783.2  | 7045.6 | 49.35 | + |
| C3 | 5/95  | 2000 | 300 | 300 | 5 | 98.1   | 19.4  | 5675.15 | 7264.1 | 37.72 | ++ |
| C4 | 95/5  | 2000 | 200 | 500 | 3 | 248.1  | 20.3  | 0       | 0      | 56.53 | -- |

[2]All failures were observed to fail in failure mode (2) - bond shearing.

We claim:

1. A ribbon (1) comprising:
   a. a first layer (2) comprising copper with a surface (15);
   b. at least a coating layer (3) superimposed over the surface (15) of the first layer (2), wherein the coating layer (3) comprises aluminum; and
   c. an intermediate layer (7);
   wherein in a cross-sectional view of the ribbon (1) an area share of the first layer (2) is in a range of from 50 to 96%, based on a total area of the cross-section of the ribbon (1);
   an aspect ratio between a width (5) and a height (6) of the ribbon (1) in the cross-sectional view is in a range of from 0.03 to less than 0.8;
   the ribbon (1) has a cross-sectional area in a range of from 25,000 μm² to 800,000 μm²; and
   wherein the intermediate layer (7) is arranged between the first layer (2) and the coating layer (3) and the intermediate layer (7) comprises at least one intermetallic phase comprising a material of the first layer (2) and a material of the coating layer (3).

2. The ribbon (1) according to claim 1, wherein an area share of the intermediate layer (7) in the cross-sectional view of the ribbon (1) is in a range of from 0.1 to 15%, based on the total area of the cross-section of the ribbon (1).

3. The ribbon (1) according to claim 1, wherein a thickness of the intermediate layer (7) is in a range of from 0.1 to 5 μm.

4. The ribbon (1) according to claim 1, wherein an area share of the coating layer (3) in the cross-sectional view of the ribbon (1) is in a range of from 3.9 to 50%, based on the total area of the cross-section of the ribbon (1).

5. The ribbon (1) according to claim 1, wherein a thickness of the first layer (2) is in a range of from 25 to 380 μm, determined at a cross-sectional view of the ribbon (1).

6. The ribbon (1) according to claim 1, wherein a thickness of the coating layer (3) is in a range of from 10 to 70 μm, determined at a cross-sectional view of the ribbon (1).

7. The ribbon (1) according to claim 1, wherein the first layer (2) comprises at least 95% by weight of copper with a purity of at least 99.9%, based on the total weight of the first layer (2).

8. The ribbon (1) according to claim 1, wherein an oxygen content of the copper in the first layer is in a range of from 0.1 to 80 ppm.

9. The ribbon (1) according to claim 1, wherein the coating layer (3) comprises at least 80% by weight of aluminum with a purity of 99.9%, based on the total weight of the coating layer (3).

10. The ribbon (1) according to claim 1, wherein a dissipated work is at least two times higher for the ribbon (1) than for a reference ribbon made from pure aluminum.

11. The ribbon (1) according to claim 1, wherein a maximum strain in a uniaxial cyclic test is at least 1.5 times higher for the ribbon (1) than for a reference ribbon made from pure aluminum.

12. The ribbon (1) according to claim 1, wherein a power cycling lifetime test is at least three times higher for the ribbon (1) than for a reference ribbon made from pure aluminum.

13. The ribbon (1) according to claim 1, wherein a pull is at least 10% higher for the ribbon (1) than for a reference ribbon made from pure aluminum.

14. A process for manufacturing a ribbon (1) comprising at least the following steps:
  a. providing a wire precursor (9) comprising a copper core (2') with a surface (15') and a coating layer (3) superimposed over the surface (15') of the copper core (2');
    wherein the coating layer (3) comprises aluminum;
    in a cross-sectional view of the wire precursor (9) an area share of the copper core (2') is in a range of from 50 to 90%, based on a total area of the cross-section of the wire precursor (9), an aspect ratio between a longest path (5') and a shortest path (6') through the wire precursor (9) in the cross-sectional view is in a range of from larger than 0.8 to 1.0, and
    wherein the wire precursor (9) has a diameter in a range of from 0.5 to 5 mm;
  b. shaping the wire precursor (9) to obtain a ribbon precursor (9'); and
  c. annealing the shaped ribbon precursor (9') to form an intermediate layer (7) and the ribbon (1).

15. A process for manufacturing a ribbon (1) comprising at least the following steps:
  A) providing a first sheet (2") comprising copper with a purity of at least 99.9%,
  B) providing at least one further sheet (3") comprising aluminum with a purity of 99.9%, wherein in cross-sectional views of the first sheet (2") and the at least one further sheet (3"), a ratio of a cross-sectional area of the first sheet (2") to a cross-sectional area of the at least one further sheet (3") is in a range of from 1:1 to 4:1;
  C) superimposing the sheets (2") and (3"), combining the sheets (2") and (3") to obtain a ribbon precursor (9'), and shaping the ribbon precursor (9') to obtain a shaped ribbon precursor (9'); and
  D) annealing the shaped ribbon precursor (9') to form an intermediate layer (7) and obtain the ribbon (1).

16. The process according to claim 14, wherein the annealing is performed at a temperature in a range of from 140° C. to 400° C. over a period of from 30 minutes to 5 hours.

17. The process according to claim 14, wherein the annealing is performed in a tube furnace (26) at a temperature in a range of from 150° C. to 600° C. at a drawing speed in a range of from 1 to 20 meters/min.

18. A ribbon (1) obtained by the process according to claim 14.

19. The ribbon (1) according to claim 18, wherein the ribbon (1) is characterized by at least one of the following features:
  a. a dissipated work is at least two times higher for the ribbon (1) than for a reference ribbon made from pure aluminum;
  b. a maximum strain in a uniaxial cyclic test is at least 1.5 times higher for the ribbon (1) than for a reference ribbon made from pure aluminum;
  c. a power cycling lifetime test is at least three times higher for the ribbon than for a reference ribbon made from pure aluminum;
  d. a pull of the ribbon (1) is at least 10% higher for the ribbon (1) than for a reference ribbon made from pure aluminum; and
  e. an electrical conductivity of the ribbon (1) is from 20% to 55% higher than an electrical conductivity of a reference ribbon made from pure aluminum.

20. An electric device (10) comprising at least two elements (11) and at least a ribbon (1) according to claim 1, wherein the ribbon (1) electrically connects the two elements (11).

21. The electric device (10) of claim 20, wherein the electrical connection is obtained by wedge bonding.

22. The electric device (10) of claim 20, wherein at least one of the elements (11) is selected from the group consisting of a substrate, an IGBT, an integrated circuit, a transistor, and a diode.

23. A propelled device (16) comprising at least one electric device (10) according to claim 20.

24. A process for making an electric device (10) comprising the steps of:
  a. providing at least two elements (11);
  b. connecting the two elements (11) through a ribbon (1) according to claim 1, wherein at least one of said connections is performed by wedge bonding.

* * * * *